United States Patent [19]
Han

[11] Patent Number: 5,500,822
[45] Date of Patent: Mar. 19, 1996

[54] ADDRESS DECODER FOR REPAIR OF MEMORY DEVICE

[75] Inventor: Byoung Y. Han, Chungcheongbuk, Rep. of Korea

[73] Assignee: LG Semicon Co., Ltd., Seoul, Rep. of Korea

[21] Appl. No.: 349,473

[22] Filed: Dec. 5, 1994

Related U.S. Application Data

[63] Continuation of Ser. No. 110,870, Aug. 24, 1993, abandoned.

[30] Foreign Application Priority Data

Aug. 24, 1992 [KR] Rep. of Korea ............... 15195/1992

[51] Int. Cl.$^6$ .................................................. G11C 13/00
[52] U.S. Cl. ............................. 365/200; 365/51; 365/63; 365/225.9; 365/230.06
[58] Field of Search ............................. 365/200, 225.7, 365/96, 51, 63, 230.06

[56] References Cited

U.S. PATENT DOCUMENTS

| | | | |
|---|---|---|---|
| 4,751,197 | 6/1988 | Wills | 437/174 |
| 4,968,643 | 11/1990 | Mukai | 437/174 |
| 5,258,953 | 11/1993 | Tsujimoto | 365/200 |
| 5,276,360 | 1/1994 | Fujira | 365/200 X |

*Primary Examiner*—Do Hyun Yoo
*Attorney, Agent, or Firm*—Morgan, Lewis and Bockius

[57] ABSTRACT

An address decoder for repair of a memory device including a conductive line being applied with a desired voltage and a plurality of repair links connected to the conductive line, the repair links being arranged adjacent to each other or one another by a predetermined number at their predetermined portions so that one or more of them can selectively be blown by once scanning of a laser beam. According to the invention, the number of times that the links are blown by the laser beam is significantly reduced, resulting in a reduction in the working time required in repairing a failed cell column using the laser beam. This has the effect of enhancing the working efficiency and reducing the probability that the repair is failed.

10 Claims, 5 Drawing Sheets

ADDRESS DECODER FOR REPAIR OF MEMORY DEVICE

CROSS-REFERENCE TO RELATED APPLICATION

This is a continuation of application Ser. No. 08/110,870, filed Aug. 24, 1993, now abandoned.

BACKGROUND OF THE INVENTION

1. Field of the Invention

The present invention relates in general to an repairing arrangement for a memory device, and more particularly to a address decoder for repair of a memory device, in which a failure of the memory device can efficiently be repaired.

2. Description of the Prior Art

It is common that a memory device such as, for example, a dynamic random access memory (DRAM) comprises redundant cell columns to guard against the case where at least one of the cell columns of a memory cell matrix has failed. For example, when one cell column of the memory cell matrix is failed, it is replaced with one of the redundant cell columns. In order to replace the failed memory cell column with the redundant cell column, it is necessary that a switching circuit be provided between an input/output (I/O) interface circuit and the memory cell matrix with the redundant cell columns.

Referring to FIG. 1, there is shown a basic model of the DRAM device with the redundant cell columns and the switching circuit. As shown in this drawing, the DRAM device comprises a memory cell matrix having a plurality of cell columns, at least one redundant cell column, a repair circuit for replacing a failed one of the cell columns of the memory cell matrix with the redundant cell column, an I/O interface circuit for inputting and outputting data between the memory device and an external device, and a pad part for applying drive signals to the repair circuit.

In FIG. 1, the repair circuit includes a plurality of npn-type transistors T1–T8, a direct current (DC) voltage source Vcc, a resistor R, an inverter I1, a plurality of repair links L1–L3 for addressing the failed one of the cell columns of the memory cell matrix, and nodes A and B. Also, the pad part includes a plurality of pads C0–C2 for applying the drive signals to the repair circuit.

Now, the operation of repairing the DRAM device in FIG. 1 will be described.

Under a normal operation, the pad C0 will go high, while the pads C1 and C2 are held low. This will turn on the transistor T4 which grounds the node B, causing the transistor T7 to be turned off and the transistors T8 and T1 to be turned on. With the pads C1 and C2 applied with a low voltage, the transistors T2 and T3 are turned off. At this time, only data from the first cell column of the memory cell matrix will be released to the node A and, since the transistor T8 is at its on state, the data will reach the I/O interface circuit.

Assume that the first cell column of the memory cell matrix is failed. To replace the first cell column with the redundant cell column, simply blow the link L1. Now when the pad C0 goes high and the pads C1 and C2 are low, the transistors T1 and T4 are turned on; however, the transistor T4 cannot ground the node B anymore since it is no longer connected.

In this case, the node B is pulled up to a high level by the resistor R. This causes the transistor T7 to be turned on and the transistor T8 to be turned off. With the transistor T8 turned off, the data from the first cell column of the memory cell matrix cannot pass to the I/O interface circuit. Instead, the data from the redundant cell column is released through the transistor T7 to the I/O interface circuit. Therefore, the redundant cell column is used instead of the failed cell column of the memory cell matrix.

Although only one redundant cell column has been used for the illustrative purpose in FIG. 1, a plurality of redundant cell columns may be used against the case where one or more of the cell columns of the memory cell matrix are failed.

If this single link redundancy scheme as shown in FIG. 1 were implemented on a device with 64 columns, it would be necessary to have 64 switching devices like the transistors T4, T5 and T8 to repair one column, one for each column. Also, 64 links would be necessary. Here, the use of the links should be noted.

As mentioned above, the links are used to grant an address of the failed cell column to the redundant cell column when the failed cell column is replaced with the redundant cell column. In this connection, a set of the links may be referred to as an address decoder.

A conventional address decoder for repair of a 1 mega DRAM will hereinafter be described with reference to FIGS. 2a and 2b.

FIG. 2a is a view illustrating the 1 mega DRAM with 3 redundant cell columns for repair and a conventional repair circuit therefor. As shown in this drawing, the 1 mega DRAM device comprises a 1 mega memory cell matrix 1 having 1024×1024 cells, a redundant cell matrix 2 having the 3 redundant cell columns, a matrix address decoder 3 being applied with a DC voltage Vcc and for addressing cell columns of the 1 mega memory cell matrix 1, and a repair address decoder 4 for granting an address of a failed one of the cell columns of the 1 mega memory cell matrix 1 to a corresponding one of the redundant cell columns of the redundant cell matrix 2 to be replaced for the failed cell column.

The matrix address decoder 3 is adapted to generate an address for applying the DC voltage Vcc selectively to the cell columns of the memory cell matrix 1. In FIG. 2, each cell column has 1024 cells and cannot be used when at least one of the cells is failed. Therefore, the failure in the DRAM is repaired by replacing the failed cell column with a corresponding one of the redundant cell columns of the redundant cell matrix 2. In order to replace the failed cell column of the memory cell matrix 1 with a corresponding one of the redundant cell columns of the redundant cell matrix 2, the repair address decoder 4 is adapted to grant an address of the failed cell column to a corresponding one of the redundant cell columns.

Now, the operation of granting the address will be described with reference to FIG. 2b.

FIG. 2b is a view illustrating a construction of the repair address decoder 4. A 10-bit signal is required to address the 1 mega DRAM in FIG. 2a since the number of the columns are $2^{10}$ or 1024. The repair address decoder 4 has a plurality of links or fuses, more particularly 10 links or fuses to address each redundant cell column in the 1 mega DRAM in FIG. 2a. For this reason, the repair address decoder 4 must have 30 links since the redundant cell matrix 2 has the 3 redundant cell columns.

In FIG. 2b, addressing only one redundant cell column is illustrated as an example. Namely, the repair address decoder 4 is shown to comprise a conductive line 5 connected to the DC voltage source Vcc and 10 linear links or fuses L10–L100 connected between the conductive line 5 and the matrix address decoder 3 and spaced apart from each other at a predetermined distance.

In operation, in the case where the third cell column of the memory cell matrix 1 in FIG. 2a is failed, the repair address decoder 4 generates an address "1100000000". This address is generated by maintaining the first and second links L10 and L20 natural while blowing the remaining links as shown in FIG. 2c. Then, upon application of the DC voltage Vcc to the conductive line 5, the address "1100000000" is applied to the matrix address decoder 3, thereby causing the redundant cell column with the address to be used instead of the failed third cell column.

A laser beam is used to blow the 8 links L30–L100 linearly connected between the conductive line 5 applied with the DC voltage Vcc and the matrix address decoder 3. The links L30–L100 are instantaneously heated and thus evaporated, when centers thereof are instantaneously scanned by the laser beam. In this manner, the links L30–L100 are blown.

However, the conventional repair address decoder has a disadvantage in that only one of the links is blown by once scanning of the laser beam since the links are arranged linearly and spaced apart from each other at the predetermined distance. Namely, in the conventional repair address decoder, the scanning of the laser beam must be tried eight times to blow all the links. As a result, the more links used, the more working time required in repairing the failed cell column using the laser beam. This results in a degradation in the working efficiency and a reduction in the productivity. Further, the more number of times that the links are blown by the laser beam increases a probability that the repair is failed.

SUMMARY OF THE INVENTION

Therefore, the present invention has been made in view of the above problem, and it is an object of the present invention to provide an address decoder for repair of a memory device, in which a failure of the memory device can efficiently be repaired.

In accordance with the present invention, the above and other objects can be accomplished by a provision of an address decoder for repair of a memory device, comprising: a conductive line being applied with a desired voltage; and a plurality of repair links connected to said conductive line, said repair links being arranged adjacent to each other or one another by a predetermined number at their predetermined portions so that one or more of them can selectively be blown by once scanning of a light beam.

According to one embodiment of this invention, defined herein is a repair address decoder which includes: (a) a conductive line having first and second substantially parallel legs; (b) a matrix address decoder; (c) first and second repair links operatively connected to the first leg and extending towards the second leg; and (d) a third repair link operatively connected to the second leg, extending towards the first leg and disposed between the first and second repair links. Each of the first, second and third links is operatively connected at one end thereof to the matrix address decoder. The matrix address decoder defines a U-shape with an open end and the first and second legs extend into the open end.

According to another definition, disclosed herein is a repair address decoder which includes: (a) a conductive line applied with a desired voltage; (b) a matrix address decoder; and (c) first and second substantially U-shaped repair links with open ends, each operatively connected at opposite ends thereof to the conductive line and to the matrix address decoder. The first and second repair links have adjacent portions close enough to one another so they can be selectively blown together by a single scanning of a light beam, particularly a laser beam.

BRIEF DESCRIPTION OF THE DRAWINGS

The above and other objects, features and advantages of the present invention will be more clearly understood from the following detailed description taken in conjunction with the accompanying drawings, in which:

FIG. 2b is a view illustrating a construction of a repair address decoder in FIG. 2a;

FIG. 3b is a view illustrating a process of generating one repair address on the basis of the construction in FIG. 3a.

DETAILED DESCRIPTION OF THE PREFERRED EMBODIMENT

Figure 1:
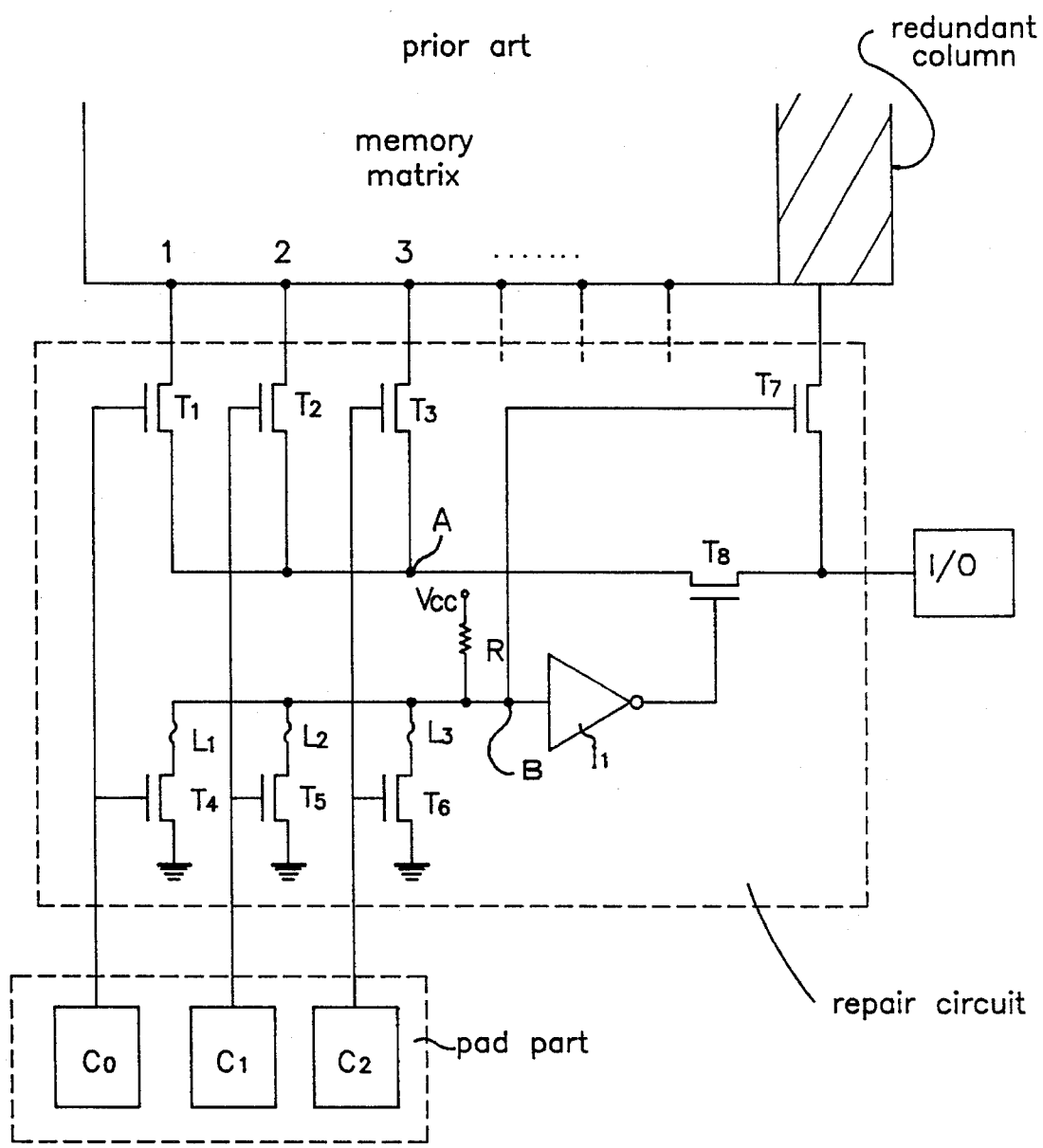
FIG. 1 is a circuit diagram illustrating a DRAM with a single redundant cell column for repair and a conventional repair circuit therefor.
Figure 2A:
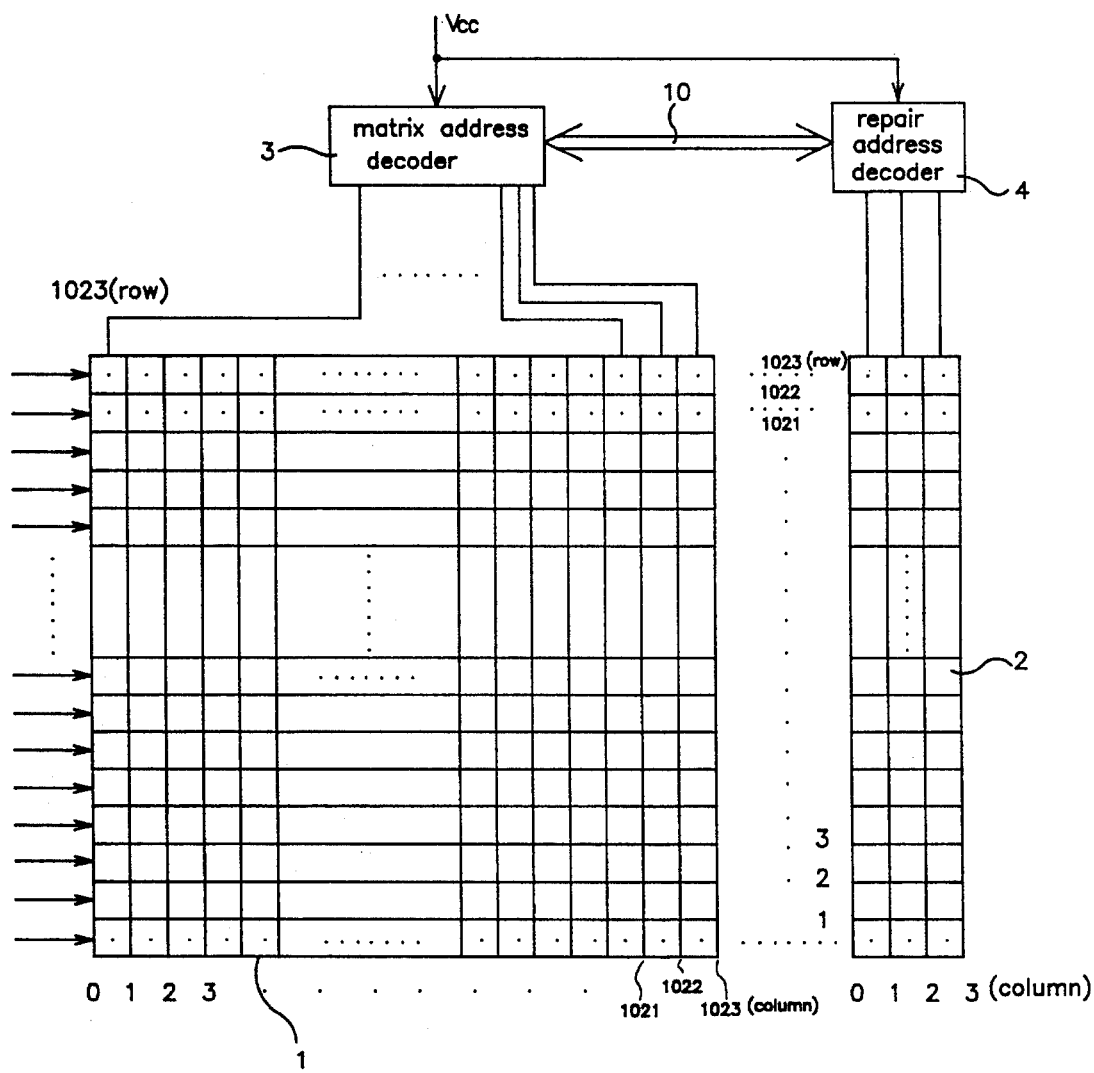
FIG. 2a is a circuit diagram illustrating a one mega DRAM with three redundant cell columns for repair and a conventional repair circuit therefor.
Figure 3A:
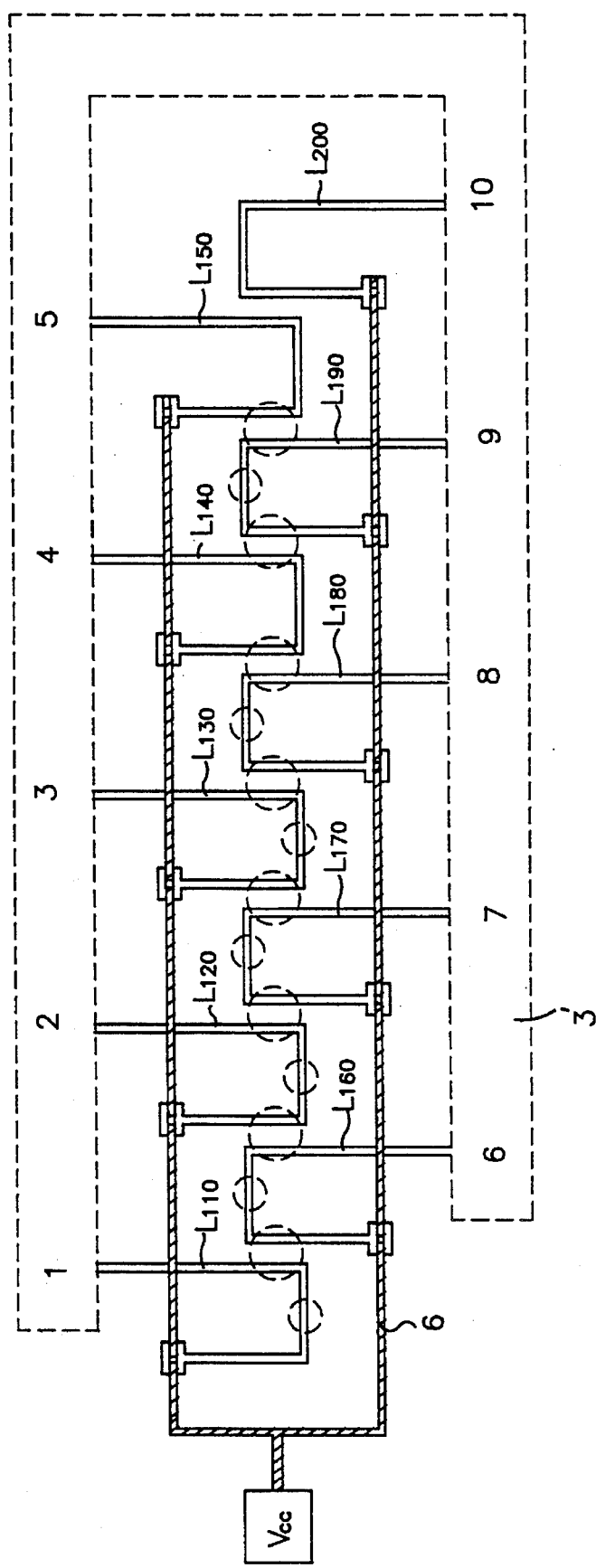
FIG. 3a is a view illustrating a construction of a repair address decoder in accordance with the present invention.

Referring to FIG. 3a, there is shown a view illustrating a construction of a repair address decoder in accordance with the present invention. As shown in this drawing, the repair address decoder comprises a conductive line 6 being applied with a desired voltage Vcc and 10 repair links L110–L200, each having a curved shape and having one end connected to the matrix address decoder 3 in FIG. 2a and the other end connected to the conductive line 6. The repair links L110–L200 are arranged adjacent to each other or one another by a predetermined number at their predetermined portions so that one or more of them can selectively be blown by once scanning of a laser beam.

In FIG. 3a, the links L110–L200 are shown to be arranged adjacent to each other by two at their predetermined portions; however, they may be arranged adjacent to one another by three or more at their predetermined portions. Namely, three or more of the links L110–L200 may be blown simultaneously. The reason why the repair links L110–L200 are arranged adjacent to each other or one another by the predetermined number at their predetermined portions is because one or more of them can selectively be blown by once scanning of the laser beam. This structure is made by only one masking process for patterning in the same manner as that of the prior art, resulting in no necessity for an additional process.

Each of the repair links L110–L200 is made of a material selected from the group consisting of polysilicon, silicide and a metal. Preferably, each repair link is made of the polysilicon or the silicide rather than the metal since the polysilicon and the silicide are perfectly evaporated; however, a small quantity of the metal remains, upon the scanning of the laser beam.

Figure 3B:
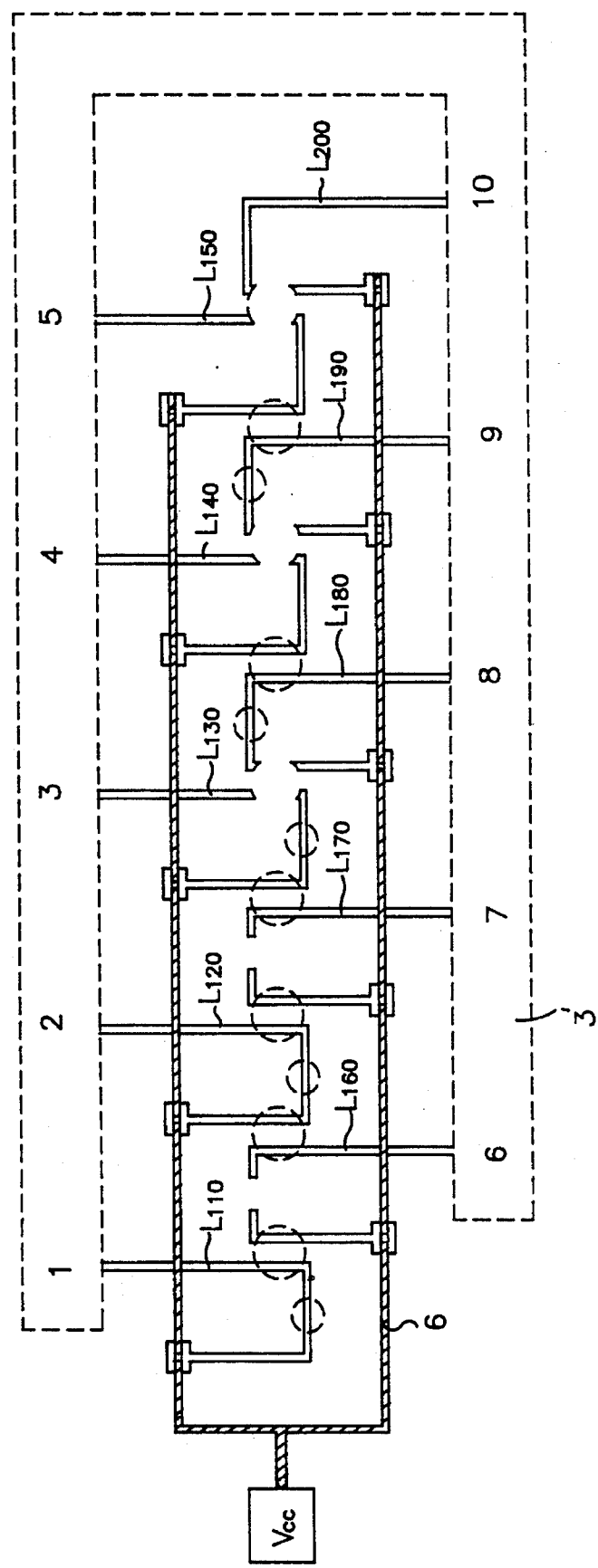

Now, it is assumed that the third cell column of the memory cell matrix 1 in FIG. 2a is failed and the operation of granting an address of the failed third cell column to a redundant cell column for repair will be described in detail with reference to FIG. 3b.

In this case, the repair address decoder must generate an address "1100000000". As mentioned previously, in the conventional repair address decoder 4 in FIG. 2b, the scanning of the laser beam must be tried eight times to blow all the links. However, in accordance with the present invention, one or more of the links in the repair address decoder can simultaneously be blown by once scanning of the laser beam to the dotted circles in FIG. 3a, since the links have the curved shapes and are arranged adjacent to each other or one another by two or more at their predetermined portions. Therefore, in order to generate the address "1100000000", the scanning of the laser beam is performed only five times as shown in FIG. 3b.

Also, according to the present invention, in the repair address decoder in FIG. 3a, the links L110–L200 may be blown by one. For example, assuming that an address "0111111111" is to be generated by the repair address decoder, only the first link L110 will be blown by the scanning of the laser beam to the dotted center circle in FIG. 3a.

Figure 2B:
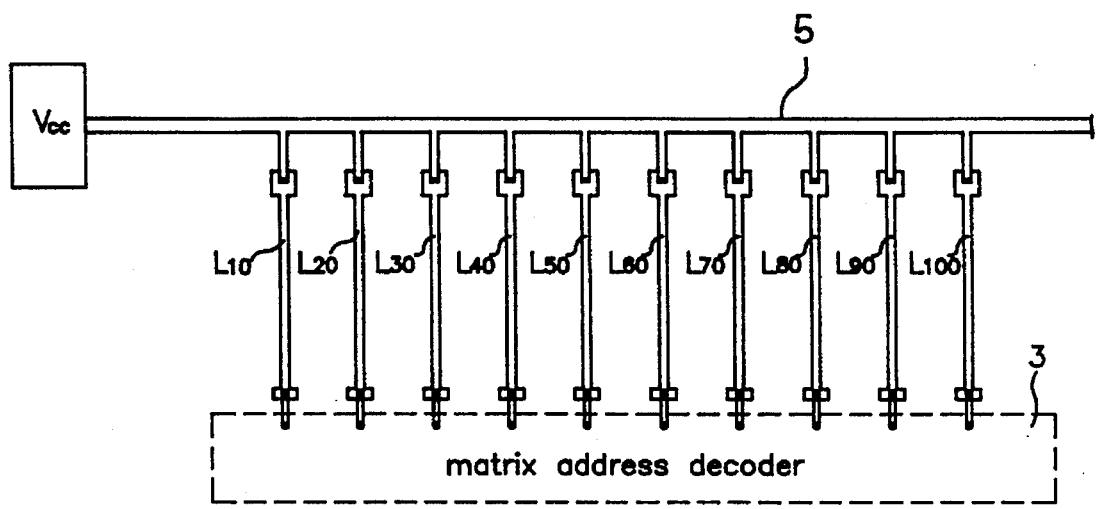
Figure 2C:
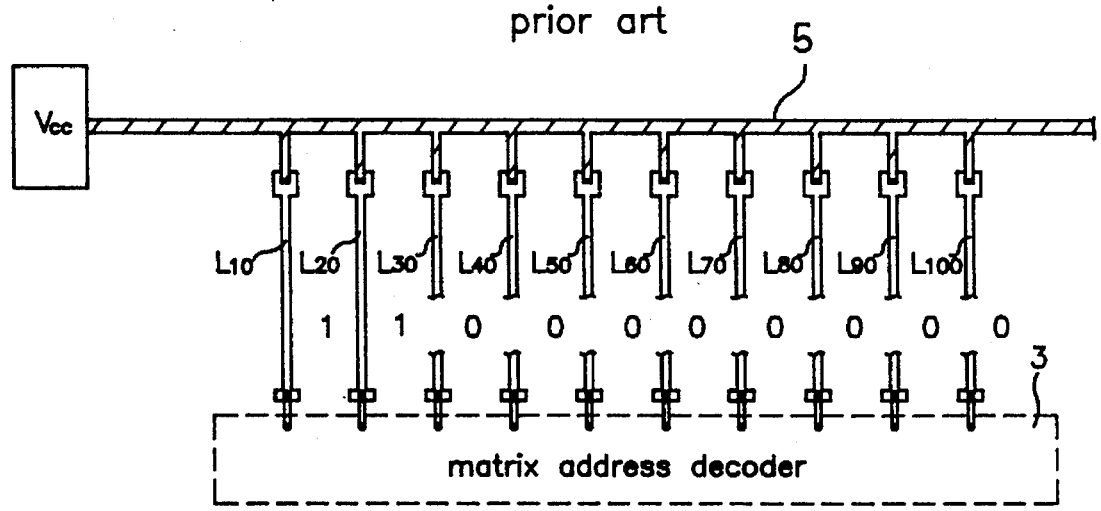
FIG. 2c is a view illustrating a process of generating one repair address on the basis of the construction in FIG. 2b.

As mentioned above, to generate the address "1100000000" in the case where the failed third cell column of the memory cell matrix 1 in FIG. 2a is repaired, the conventional repair address decoder in FIG. 2b is subjected to the eight times scanning of the laser beam; but, the repair address decoder of the present invention in FIG. 3a is subjected to only the five times scanning of the laser beam. Namely, according to the present invention, three times scanning of the laser beam is omitted as compared with the conventional repair address decoder. This has the effect of reducing the repairing time and the probability that the repair is failed.

As apparent from the above description, according to the present invention, the repair links have the curved shapes, are connected between the matrix address decoder and the conductive line applied with the DC voltage and are arranged adjacent to each other or one another by the predetermined number at their predetermined portions so that one or more of them can selectively be blown by once scanning of the laser beam. Therefore, the number of times that the links are blown by the laser beam is significantly reduced, resulting in a reduction in the working time required in repairing the failed cell column using the laser beam. This has the effect of enhancing the working efficiency and reducing the probability that the repair is failed.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A repair address decoder comprising:

a conductive line having first and second substantially parallel legs;

a matrix address decoder;

first and second repair links operatively connected to said first leg and extending towards said second leg; and a third repair link operatively connected to said second leg, extending towards said first leg and disposed between said first and second repair links;

wherein each of said first, second and third links is operatively connected at one end thereof to said matrix address decoder; and wherein said matrix address decoder defines a U-shape with an open end and said first and second legs extend into said open end.

2. The repair address decoder of claim 1 wherein each of said first, second and third links has a curved shape.

3. The repair address decoder of claim 1 further comprising a fourth repair link operatively connected to said second leg and extending towards said first leg.

4. The repair address decoder of claim 1 wherein said first and third repair links have portions in close enough proximity to one another to be selectively blown together by a single scanning of a light beam.

5. The repair address decoder of claim 4 wherein said third and second repair links have portions in close enough proximity to be selectively blown together by a single scanning of a light beam.

6. A repair address decoder comprising:

a conductive line applied with a desired voltage;

a matrix address decoder; and first and second substantially U-shaped repair links with open ends, each operatively connected at opposite ends thereof to said conductive line and to said matrix address decoder;

wherein said first and second repair links have adjacent portions close enough to one another so they can be selectively blown together by a single scanning of a light beam.

7. The repair address decoder of claim 6 wherein the light beam comprises a laser beam.

8. The repair address decoder of claim 6 wherein said links are made of polysilicon.

9. The repair address decoder of claim 6 wherein said links are made of silicide.

10. The repair address decoder of claim 6 wherein said links are made of metal.

* * * * *